United States Patent
Harada et al.

(10) Patent No.: US 9,735,548 B2
(45) Date of Patent: Aug. 15, 2017

(54) SEMICONDUCTOR LASER ELEMENT AND SEMICONDUCTOR LASER DEVICE

(71) Applicant: NICHIA CORPORATION, Anan-shi, Tokushima (JP)

(72) Inventors: Susumu Harada, Anan (JP); Yasuhiro Kawata, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 15/376,758

(22) Filed: Dec. 13, 2016

(65) Prior Publication Data
US 2017/0093131 A1   Mar. 30, 2017

Related U.S. Application Data

(62) Division of application No. 14/838,737, filed on Aug. 28, 2015, now Pat. No. 9,553,425.

(30) Foreign Application Priority Data

Sep. 10, 2014 (JP) ................................ 2014-184148

(51) Int. Cl.
*H01L 21/78* (2006.01)
*H01S 5/323* (2006.01)
(Continued)

(52) U.S. Cl.
CPC ........ *H01S 5/32341* (2013.01); *H01S 5/0202* (2013.01); *H01S 5/028* (2013.01); *H01S 5/22* (2013.01)

(58) Field of Classification Search
CPC ......... H01L 21/78; H01L 21/76; H01S 5/028; H01S 5/22; H01S 5/0201
(Continued)

(56) References Cited

U.S. PATENT DOCUMENTS 6,025,250 A * 2/2000 Ha .................... H01L 21/28123
257/E21.206
6,475,878 B1 * 11/2002 Slepcevic ............ B28D 5/0023
257/E21.599
(Continued)

FOREIGN PATENT DOCUMENTS

JP  10-070335 A  3/1998
JP  2002-252185 A  9/2002
(Continued)

*Primary Examiner* — Tuan Nguyen
(74) *Attorney, Agent, or Firm* — Global IP Counselors, LLP

(57) ABSTRACT

A semiconductor laser element includes a semiconductor structure having an optical cavity and a protective film. The semiconductor structure includes a pair of stepped parts at both ends of the semiconductor structure in a cavity width direction, and a first texture pattern extending in a cavity length direction on a bottom surface of each of the stepped parts. The first texture pattern includes recesses and/or protrusions along the cavity length direction. The protective film covers at least part of the first texture pattern to define a second texture pattern having upper surfaces and bottom surfaces. A length of the bottom surfaces of the second texture pattern is less than a height from the bottom surfaces to a surface of the semiconductor structure. A length of the upper surfaces of the second texture pattern is less than a height from the upper surfaces to the surface of the semiconductor structure.

17 Claims, 19 Drawing Sheets

(51) Int. Cl.
*H01S 5/028* (2006.01)
*H01S 5/02* (2006.01)
*H01S 5/22* (2006.01)

(58) Field of Classification Search
USPC .................................................. 438/460, 459
See application file for complete search history.

(56) References Cited

U.S. PATENT DOCUMENTS

| | | | |
|---|---|---|---|
| 7,858,994 B2* | 12/2010 | Daniels | G02F 1/133603 |
| | | | 257/100 |
| 2005/0029646 A1* | 2/2005 | Ueda | H01L 21/78 |
| | | | 257/687 |
| 2005/0186760 A1 | 8/2005 | Hashimura et al. | |
| 2006/0166478 A1 | 7/2006 | Sugahara et al. | |
| 2007/0264802 A1* | 11/2007 | Sakamoto | B82Y 20/00 |
| | | | 438/478 |
| 2008/0049806 A1 | 2/2008 | Sugahara et al. | |
| 2010/0189146 A1 | 7/2010 | Bessho et al. | |
| 2012/0033701 A1 | 2/2012 | Bessho et al. | |
| 2014/0030850 A1* | 1/2014 | Sekiya | H01L 21/78 |
| | | | 438/113 |

FOREIGN PATENT DOCUMENTS

| | | | | |
|---|---|---|---|---|
| JP | 2004-165227 A | 6/2004 | | |
| JP | 2004-311964 A | 11/2004 | | |
| JP | 2007-329459 A | 12/2007 | | |
| JP | 2010-177455 A | 8/2010 | | |
| JP | 2010-192882 A | 9/2010 | | |
| JP | 2010-199139 A | 9/2010 | | |
| JP | 2004-062590 | * 11/2014 | ............. | H01S 5/323 |

* cited by examiner

SEMICONDUCTOR LASER ELEMENT AND SEMICONDUCTOR LASER DEVICE

CROSS-REFERENCE TO RELATED APPLICATIONS

This application is a divisional application of U.S. patent application Ser. No. 14/838,737 filed on Aug. 28, 2015. This application claims priority to Japanese Patent Application No. 2014-184148 filed on Sep. 10, 2014. The entire disclosures of U.S. patent application Ser. No. 14/838,737 and Japanese Patent Application No. 2014-184148 are hereby incorporated herein by reference.

BACKGROUND

Technical Field

The present disclosure relates to a semiconductor laser element, methods of manufacturing the same and semiconductor laser device.

Related Art

As prior art related to splitting up a semiconductor wafer, JP-H10-70335A discloses that a groove extending parallel to a stripe electrode is formed in the lower surface of a substrate, a blade is placed along the groove, and force is exerted on the blade to split the semiconductor wafer.

With a splitting method such as this, the segmentation of the semiconductor wafer commences as a crack originating in the groove formed on the lower surface of the substrate, and this crack proceeds from the lower surface of the substrate toward the upper surface of the semiconductor structure. The semiconductor wafer is then completely separated on the upper surface side of the semiconductor structure. In the complete separation of the semiconductor wafer, the semiconductor structure is sometimes chipped in a direction parallel to the stripe electrode at the portion where the semiconductor wafer is completely separated, so that burrs sometimes are produced. The burrs have such a shape that just one of the ends is linked to the semiconductor structure, and the remaining portion is cut away from the semiconductor structure. If the burrs are of at least a certain length, then when, for example, a semiconductor laser device is produced in which an upper surface side of the semiconductor structure in a semiconductor laser element obtained by dividing a semiconductor wafer faces to a support member, and the semiconductor laser element is fixed via an adhesive member to a metal film provided to the surface of the support member, the burrs may come into contact with the metal film or the adhesive member and may cause a short-circuit. If such short-circuiting occurs, it can lead to lower reliability of the semiconductor laser device.

SUMMARY

A semiconductor laser element according to one aspect includes a semiconductor structure having an optical cavity and a protective film. The semiconductor structure includes a pair of stepped parts arranged on a first main surface side of the semiconductor structure at both ends of the semiconductor structure in a cavity width direction with the stepped parts extending along a cavity length direction, and a first texture pattern extending in the cavity length direction on a bottom surface of each of the stepped parts, the first texture pattern including a plurality of recesses and/or a plurality of protrusions along the cavity length direction. The protective film covers at least part of the first texture pattern to define a second texture pattern having upper surfaces and bottom surfaces that are at a lower position than the upper surfaces. A length of the bottom surfaces of the second texture pattern along the cavity length direction is less than a height from the bottom surfaces of the second texture pattern to a surface on the first main surface side of the semiconductor structure. A length of the upper surfaces of the second texture pattern along the cavity length direction is less than a height from the upper surfaces of the second texture pattern to the surface on the first main surface side of the semiconductor structure.

A semiconductor laser element according to another aspect includes a semiconductor structure having an optical cavity and a protective film. The semiconductor structure includes a pair of stepped parts arranged on a first main surface side of the semiconductor structure at both ends of the semiconductor structure in a cavity width direction with the stepped parts extending along a cavity length direction, and a first texture pattern extending along the cavity length direction on a bottom surface of each of the stepped parts. The first texture pattern includes a plurality of recesses and/or a plurality of protrusions along the cavity length direction. The first texture pattern includes upper surfaces that coincide with upper surfaces of the protrusions that protrude upward from the bottom surface of a corresponding one of the stepped parts, and bottom surfaces that are lower than the upper surfaces of the first texture pattern and have the same height as the bottom surface of the corresponding one of the stepped parts. The upper surfaces of the first texture pattern and the bottom surfaces of the first texture pattern are arranged in a repeating pattern along the cavity length direction. The protective film covers at least part of the first texture pattern to define a second texture pattern along the cavity length direction.

A semiconductor laser element according to another aspect includes a semiconductor structure having an optical cavity and a protective film. The semiconductor structure includes a pair of stepped parts arranged on a first main surface side of the semiconductor structure at both ends of the semiconductor structure in a cavity width direction with the stepped parts extending along a cavity length direction, and a first texture pattern extending in the cavity length direction on a bottom surface of each of the stepped parts, the first texture pattern including a plurality of recesses and/or a plurality of protrusions along the cavity length direction. The protective film covers at least part of the first texture pattern. A thickness of the protective film formed on bottom surfaces of the first texture pattern is less than a height from the bottom surfaces of the first texture pattern to upper surfaces of the first texture pattern.

A semiconductor laser device according to one aspect includes the semiconductor laser element according to one of the above aspects, and a support member on which the semiconductor laser element is mounted, with a side of the semiconductor laser element on which the stepped parts are formed being fixed to the support member with an adhesive member.

According to the embodiments of the present invention, a semiconductor laser element that is more reliable because the possibility of short-circuiting caused by burrs is reduced can be provided.

BRIEF DESCRIPTION OF THE DRAWINGS

FIGS. 1a and 1b are diagrams illustrating a method for manufacturing the semiconductor laser element according to an embodiment, with FIG. 1a being a plan view, FIG. 1b a cross section along the A-A line in FIG. 1a;

FIGS. 2a and 2b are diagrams illustrating a method for manufacturing the semiconductor laser element according to another embodiment, with FIG. 2a being a plan view, FIG. 2b a cross section along the A-A line in FIG. 2a;

FIGS. 3a to 3c are diagrams illustrating a method for manufacturing the semiconductor laser element according to still another embodiment, with FIG. 3a being a plan view, FIG. 3b a cross section along the A-A line in FIG. 3a, FIG. 3c a cross section along the B-B line in FIG. 3a;

FIGS. 4a to 4c are diagrams illustrating a method for manufacturing the semiconductor laser element according to still another embodiment, with FIG. 4a being a plan view, FIG. 4b a cross section along the A-A line in FIG. 4a, FIG. 4c a cross section along the B-B line in FIG. 4a;

FIGS. 5a to 5c are diagrams illustrating a method for manufacturing the semiconductor laser element according to still another embodiment, with FIG. 5a being a plan view, FIG. 5b a cross section along the A-A line in FIG. 5a, FIG. 5c a cross section along the B-B line in FIG. 5a;

FIGS. 8a to 8b are diagrams illustrating a method for manufacturing the semiconductor laser element according to still another embodiment, with FIG. 8a being a plan view, FIG. 8b a cross section along the A-A line in FIG. 8a, FIG. 8c a cross section along the B-B line in FIG. 8a;

FIGS. 9a to 9b are diagrams illustrating a method for manufacturing the semiconductor laser element according to another embodiment, with FIG. 9a being a plan view, FIG. 9b a cross section along the A-A line in FIG. 9a;

DETAILED DESCRIPTION OF THE EMBODIMENTS

Figure 1A:
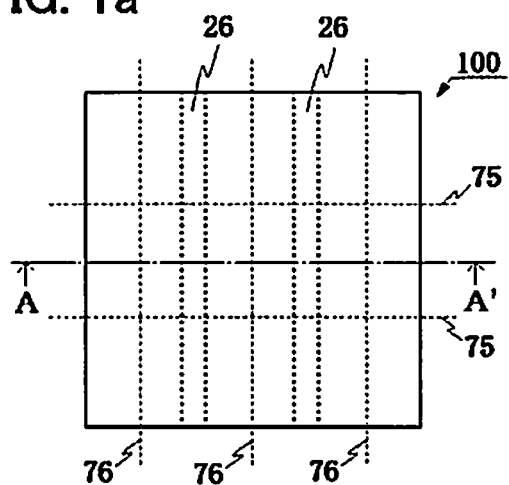

Embodiments for implementing a semiconductor laser element and a method of manufacturing the semiconductor laser element of the present invention will be described below with reference to the accompanying drawings. In the following embodiments that embody the technological concept of the present invention are just examples, and unless otherwise specified, the constituent parts discussed in the embodiments are not intended to limit the scope of the present invention. Further, constitutions described in examples and the embodiments can be employed in other examples and embodiments.

The sizes and the arrangement relationships of the members in each of drawings are occasionally shown exaggerated for ease of explanation.

Hatching may be used in each of drawings to facilitate understanding of the embodiments.

The B-B lines in FIGS. 3-5 coincide with the second line.

First Embodiment

The method for manufacturing a semiconductor laser element 1000 according to the first embodiment will be described through reference to FIGS. 1 to 9. The semiconductor laser element 1000 obtained by the method according to the first embodiment will be described through reference to FIG. 10. Also, the method for manufacturing a semiconductor laser device 10000 according to the first embodiment will be described through reference to FIG. 11.

The method for manufacturing the semiconductor laser element 1000 according to the first embodiment is a method for manufacturing a plurality of semiconductor laser elements 1000 by splitting a semiconductor wafer 100 along first lines 75 that are parallel to a cavity width direction 26, and second lines 76 that are parallel to a cavity length direction 26. The method include the steps of preparing the semiconductor wafer 100; forming grooves 25 that extend along the second lines 76 on a main surface 100a side of the semiconductor wafer 100, and forming a first texture pattern 30 along the second lines 76 on the bottom surface of the grooves 25; forming a second texture pattern 50 along the second lines 76 by covering at least a part of the first texture pattern 30 with a protective film 40; and splitting the semiconductor wafer 100 along the first lines 75, and splitting along the second lines 76 using the other main surface 100b of the semiconductor wafer 100 as a starting point.

The split of the semiconductor wafer 100 along the second lines 76 is performed such that the dividing of the semiconductor wafer 100 is started from the main surface 100b (the second main surface) side of the semiconductor wafer 100 toward the main surface 100a (the first main surface) side, and then the wafer is completely separated at the bottom surfaces of the grooves 25 located on the main surface 100a side of the semiconductor wafer 100.

In the case where the upper surfaces of the protective film 40 and the bottom surfaces of the grooves 25 are flat, then when the semiconductor wafer 100 is completely separated the semiconductor structure 20 and the protective film 40 are partially chipped at the portions where the wafer is completely separated, so that long and slender burrs may be produced.

In view of this, with the method for manufacturing the semiconductor laser element 1000 according to this embodiment, the first texture pattern 30 and the second texture pattern 50 are formed at the portions of complete separation (at the first surface). With this structure, in the case where burrs are produced during the separation of the wafer, lengths of the burrs can correspond to lengths of the upper surfaces 50a and/or bottom surfaces 50b of the second texture pattern 50 in the plan view, so that the lengths of the burrs can be kept short. For example, in the case where a semiconductor laser device is produced in which the upper surface side of the semiconductor structure (the side on which ridges are formed) faces to the support member in a semiconductor laser element obtained by splitting a semiconductor wafer, and a semiconductor laser element is fixed via an adhesive member made of an electroconductive material to a metal film provided to the surface of the support member, keeping the burrs to have short lengths allows that no burrs will come into contact with the metal film or the adhesive member, so that the possibility of short-circuiting can be reduced. This reduction in the possibility of the occurrence of short-circuiting improves the reliability of the semiconductor laser device.

Step of Preparing Semiconductor Wafer 100

Figure 1B:
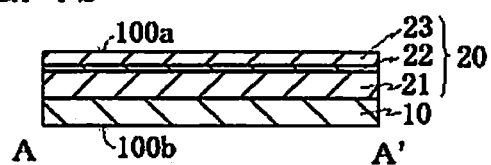

As shown in FIGS. 1a to 1c, the semiconductor wafer 100 according to this embodiment has a substrate 10, on which is disposed a semiconductor structure 20 in which an n-side semiconductor layer 21, an active layer 22, and a p-side semiconductor layer 23 are formed in that order from the substrate 10 side. In this embodiment, the substrate 10 is a substrate made of GaN, and the each layer of the semiconductor structure 20 is $In_xAl_yGa_{1-x-y}N$ ($0 \leq x \leq 1$, $0 \leq y \leq 1$, $0 \leq x+y \leq 1$). The n-side semiconductor layer 21 can also include an n-type nitride semiconductor layer containing silicon or another such n-type impurity, and the p-side semiconductor layer 23 can include a p-type nitride semiconductor layer containing magnesium or another such p-type impurity.

The semiconductor structure 20 and the substrate 10 are preferably made of a cleavable material. This allows the semiconductor wafer 100 to be cleaved to form a cleavage plane, and this cleavage plane can be used as a cavity end face of a semiconductor laser element. In the case where the substrate 10 is made of an electroconductive material, it is more likely that short-circuiting will be caused by burrs, so the method for manufacturing a semiconductor laser element according to the present embodiment is an effective way to prevent short-circuiting caused by burrs.

The n-side semiconductor layer 21 may also serve as the substrate 10. Furthermore, the material of the substrate 10 can be the same as the material of the n-side semiconductor layer 21.

Step of Forming Grooves 25 and First Texture Pattern 30

As shown in FIGS. 2 to 5, the grooves 25 that extend along the second lines 76 are formed on the main surface 100a side of the semiconductor wafer 100, and the first texture pattern 30 is formed along the second lines 76 on the bottom surfaces of the grooves 25.

Figure 2A:
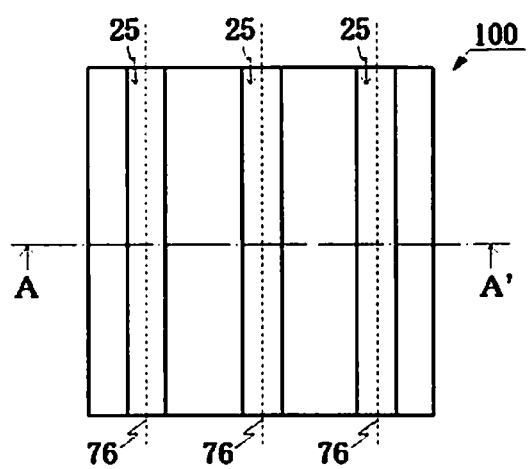
Figure 2B:
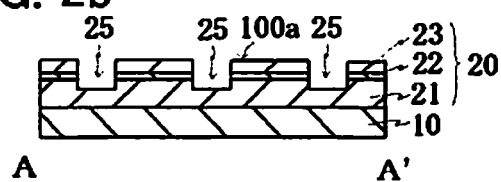

In the step of forming the grooves 25, first a mask (such as $SiO_2$) is formed over the entire main surface 100a of the semiconductor wafer 100, and then the mask is removed from the portions that will become grooves. The remaining mask is used as an etching mask, and the semiconductor wafer 100 is etched until the n-side semiconductor layer 21 is exposed, after which the mask is removed. As shown in FIGS. 2a to 2b, this forms the grooves 25 extending along the second lines 76.

Figure 3A:
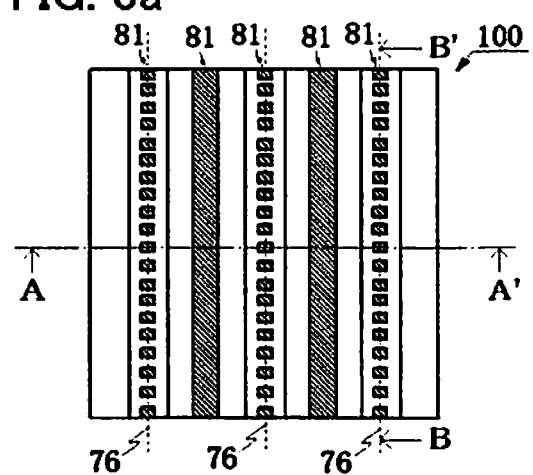
Figure 3C:
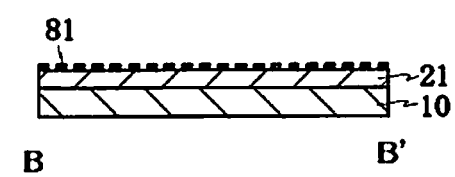
Figure 3B:
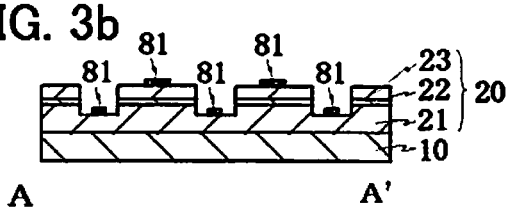
Figure 4A:
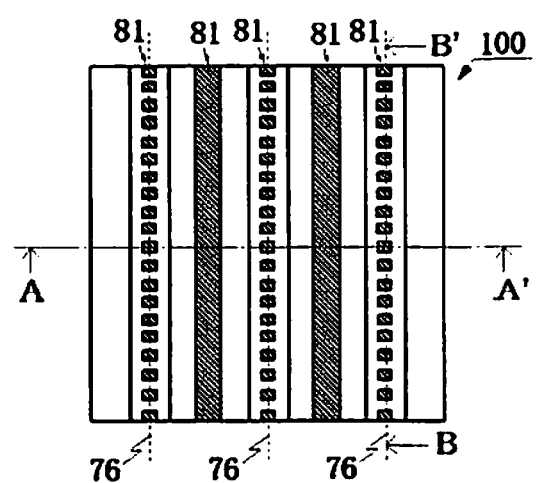
Figure 4C:
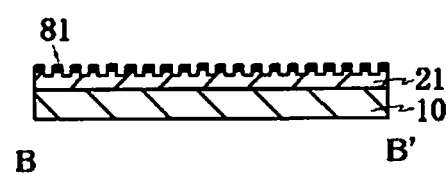
Figure 4B:
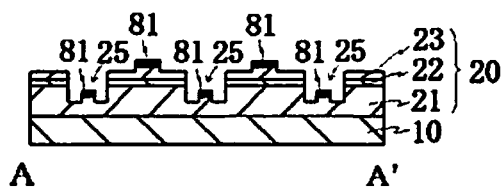
Figure 5A:
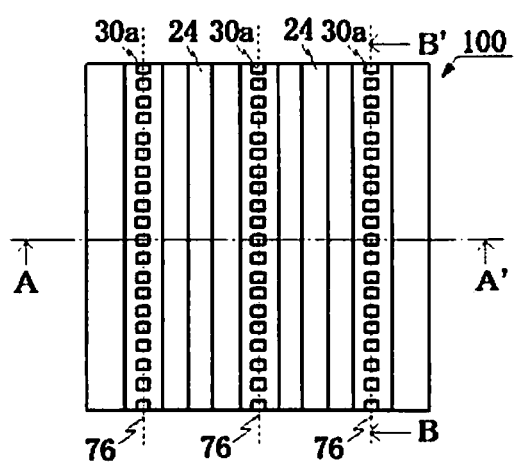
Figure 5C:
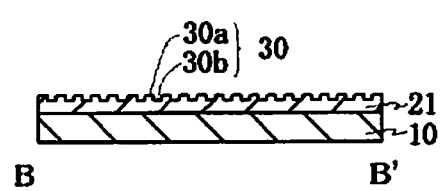
Figure 5B:
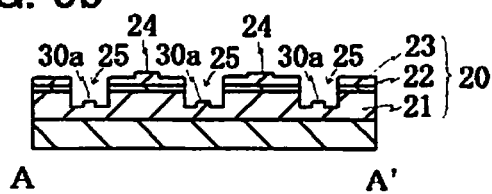

After the grooves 25 have been formed, the first texture pattern 30 is formed. First, as shown in FIG. 3a-3c, a mask 81 (such as $SiO_2$) is formed by photolithography over the regions that will become the ridges 24, and over the regions that will become the upper surfaces 30a of the first texture pattern 30. The ridges 24 are stripe-shaped protruding components that run in the same direction as the second lines 76. Next, as shown in FIGS. 4a to 4c, using the mask 81 as an etching mask, a portion of the semiconductor structure 20 is etched away to form the ridges 24 on the surface of the p-side semiconductor layer 23 of the semiconductor structure 20, and to form protruding portions that are higher than the bottom surfaces of the grooves 25 in the bottom surfaces of the grooves 25. As shown in FIGS. 5a to 5c, the mask 81 present on the upper surfaces 30a of the first texture pattern 30 and on the ridges 24 is removed to form the first texture pattern 30 extending along the second lines 76, on the bottom surfaces of the grooves 25. In the plan view, region where the ridges 24 are provided correspond to an optical cavity. The mask 81 on the upper surfaces 30a of the first texture pattern 30 may also be left in portion, instead of being removed.

Grooves 25

The formation of the grooves 25 makes the semiconductor wafer 100 thinner at the portions where the grooves 25 are formed, which can improve the splitting accuracy along the second lines 76, and in addition, when a semiconductor laser device 10000 (discussed below) is formed, the bottom surfaces of the grooves 25, which is where burrs are generated, can be isolated from the metal film 3000 and the adhesive member 4000 in this embodiment, making it less likely that burrs will touch the metal film 3000 and/or the adhesive member 4000 and cause short-circuiting.

The grooves 25 may be deep enough to expose the n-side semiconductor layer 21 at the bottom surfaces of the grooves, or deep enough to expose the substrate 10. In the case where the grooves 25 are deep enough to expose the substrate 10, however, when the grooves 25 are formed by etching, time for the etching will increase and thus productivity will suffer, so it is preferable to etch until the n-side semiconductor layer 21 is exposed, and then halt the etching before the substrate 10 is exposed. As to the depth of the grooves 25, 0.5 to 5 μm is preferable, and 1 to 3.5 μm is more preferable. The phrase "depth of the grooves 25" here refers to the depth from the upper surface of the p-side semiconductor layer 23 excluding the ridges 24, to the bottom surfaces of the grooves 25. The width of the grooves 25 in the cavity width direction is preferably from 50 to 600 μm. This allows for good splitting along the first lines 75 and the second lines 76.

Examples of methods for forming the grooves 25 include dry etching and wet etching.

First Texture Pattern 30

The first texture pattern 30 includes the "upper surfaces 30a" that coincide with the upper surfaces of protrusions that protrude upward from the bottom surfaces of the grooves 25 as shown in FIG. 5b, and the "bottom surfaces 30b" that are lower than the upper surfaces 30a (the same height as the bottom surfaces of the grooves 25) as shown in FIG. 5c, and the upper surface 30a and the bottom surface 30b are arranged in a repeating pattern along the second lines 76.

As shown in FIG. 5a, the first texture pattern 30 is preferably formed continuously in the entire bottom surfaces of the grooves 25 along with the second lines 76. Consequently, in the case where burrs are produced at any portion in the second lines 76 on the bottom surfaces of the grooves 25, lengths of the burrs can be kept to the desired length or less.

The lengths of the upper surfaces 30a and the bottom surfaces 30b of the first texture pattern 30 along the second lines 76 are both preferably at least 0.5 μm and no more than 5 μm, with at least 1 μm and no more than 3 μm being more preferable. The length of the upper surfaces 30a of the first texture pattern 30 in a direction perpendicular to the direction in which the second lines 76 extended can be 3 μm to 10 μm, for example. Within this range, on completely spiking the semiconductor wafer 100 along the second lines 76, the separated locations will be less likely to be outside the region of the first texture pattern 30. Also, the height difference between the upper surfaces 30a and the bottom surfaces 30b of the first texture pattern 30 can be between 0.2 μm and 0.5 μm, for example. Within this range, the lengths of the burrs that are generated during splitting can be reduced effectively.

Surfaces that link the upper surfaces 30a and the bottom surfaces 30b of the first texture pattern 30 are not limited to being perpendicular to the bottom surfaces 30b as shown in FIG. 5c, and may instead be tapered or inverse-tapered.

The first texture pattern 30 may also include a jagged pattern with no upper surfaces 30a or bottom surfaces 30b.

The first texture pattern 30 is not limited to the pattern discussed above, and recesses may be formed periodically along the second lines 76 in the bottom surfaces of the grooves 25, creating of "upper surfaces" the same height as the bottom surfaces of the grooves 25 and "bottom surfaces" at a lower position than the bottom surfaces of the grooves 25, in a repeating pattern along the second lines 76, or, with respect to the bottom surfaces of the grooves 25, the pattern may have both protrusion that protrude upward from the bottom surfaces of the grooves 25 and recesses that are recessed from the bottom surfaces of the grooves 25.

In the above description of the step of forming the first texture pattern 30 and the grooves 25, after the grooves 25 are formed, the ridges 24 and the first texture pattern 30 are formed in parallel, but the order is not limited to this. Specifically, after the ridges 24 and the first texture pattern 30 are formed at the same time, the grooves 25 can be formed in the region where the first texture pattern 30 has been formed. Even in the case where the grooves 25 are thus formed after the first texture pattern 30 has been formed, the shape of the first texture pattern 30 is maintained, and the first texture pattern 30 remains on the bottom surfaces of the grooves 25. It is also possible for the ridges 24, the grooves 25, and the first texture pattern 30 each to be formed separately. In this case, they may be formed in any order.

Step of Forming Second Texture Pattern 50

Figure 6A:
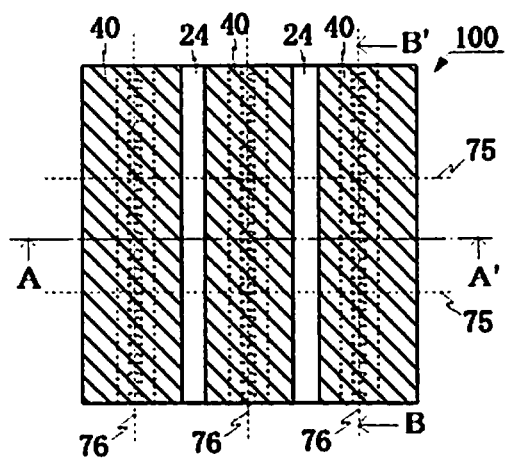
FIGS. 6a to 6d are diagrams illustrating a method for manufacturing the semiconductor laser element according to still another embodiment, with FIG. 6a being a plan view, FIG. 6b a cross section along the A-A line in FIG. 6a, FIG. 6c a cross section along the B-B line in FIG. 6a, and FIG. 6d a detail view of FIG. 6c.
Figure 6B:
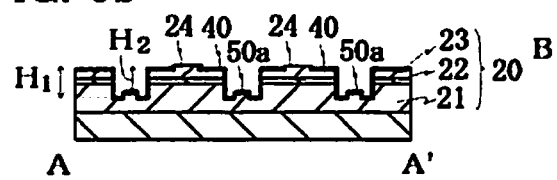
Figure 6C:
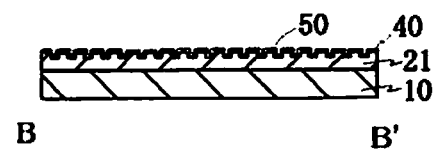
Figure 6D:
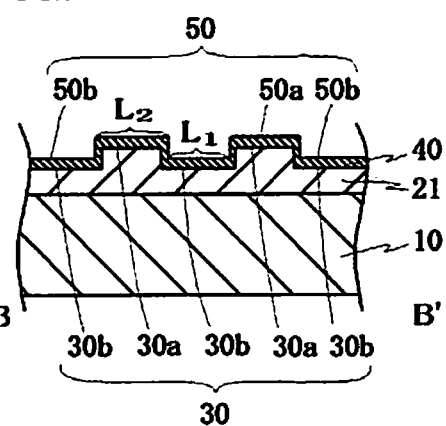

As shown in FIGS. 6a to 6d, the second texture pattern 50 according to the first embodiment is formed by covering the entire first texture pattern 30 with a protective film 40. The second texture pattern 50 formed by the method according to the first embodiment can be formed in fewer steps than the second texture patterns (51 and 52) formed by the methods according to the second and third embodiments (discussed below). As shown in FIG. 6d, the second texture pattern 50 is defined by the shape of the protective film 40 formed on the first texture pattern 30 (that is, on the upper surfaces 30a and the bottom surfaces 30b), and is a pattern in which "upper surfaces 50a" and "bottom surfaces 50b" that are at lower positions than the upper surfaces 50a repeat along the second lines 76. Here, the phrase "covering the entire first texture pattern 30 with a protective film 40" encompasses forming the protective film 40 on the upper surfaces 30a and the bottom surfaces 30b of the first texture pattern 30 and on the surfaces that link these upper surfaces 30a and bottom surfaces 30b, and also encompasses forming the protective film 40 on the upper surfaces 30a and the bottom surfaces 30b of the first texture pattern 30, but not on the surfaces that link these upper surfaces 30a and bottom surfaces 30b.

The second texture pattern 50 is not used to start splitting like as the splitting commencement grooves 83 (discussed below), but are formed on the side where the semiconductor wafer 100 will finally be separated, and are formed in order to control the length of burrs produced in the complete separation of the semiconductor wafer 100.

Forming the protective film 40 over the first texture pattern 30 and forming the second texture pattern 5 allows each texturing to be formed on the surfaces of the protective film 40 and the semiconductor structure 20 along the second lines 76, so that the length of burrs produced by splitting can be reduced.

Also, if no protective film 40 is formed over the first texture pattern 30, the burrs produced during the splitting of the semiconductor wafer 100 will be made up of just the material of the semiconductor structure 20 (a material that can conduct electricity), but as in this embodiment, in the case where the insulating protective film 40 is formed over the first texture pattern 30, a portion of the surface of the burrs will be made up of the protective film 40.

Such configuration allows preventing short-circuiting if the portion of the burrs made up of the protective film comes into contact with another electroconductive material such as the metal film 3000 or the adhesive member 4000.

The second texture pattern 50 has the upper surfaces 50a and the bottom surfaces 50b at a lower position than the upper surfaces 50a. Preferably, the length of the bottom surfaces 50b of the second texture pattern 50 along the second lines 76, which is "$L_1$" shown in FIG. 6d, is less than the height from the bottom surfaces 50b of the second texture pattern 50 to the surface on the main surface 100a side of the semiconductor wafer 100 (the upper surfaces of the ridges 24), which is "$H_1$" shown in FIG. 6b. It is also preferable that the length of the upper surfaces 50a of the second texture pattern 50 along the second lines 76, which is "$L_2$" shown in FIG. 6d, is less than the height from the upper surfaces 50a of the second texture pattern 50 to the surface on the main surface 100a side of the semiconductor wafer 100 (the upper surfaces of the ridges 24), which is "$H_2$" shown in FIG. 6b. Consequently, in the case where burrs are produced on the bottom surfaces 50b of the second texture pattern 50 during splitting of the semiconductor wafer 100, the length of the burrs is controlled to be less than the length of the bottom surfaces 50b of the second texture pattern 50 along the second lines 76, so it can be prevented that the distal ends of the burrs will reach the upper surfaces of the ridges 24. Also, in the case where burrs are produced on the upper surfaces 50a of the second texture pattern 50 during splitting of the semiconductor wafer 100, the length of the burrs is controlled to be less than the length of the upper surfaces 50a of the second texture pattern 50 along the second lines 76, so it can be prevented that the distal ends of the burrs will reach the upper surfaces of the ridges 24. If the burrs have such lengths that they reach beyond the upper surfaces of the ridges 24, then when the semiconductor laser device 10000 shown in FIG. 10 (discussed below) is produced, for example, the burrs may cause short-circuiting between the semiconductor laser element 1000 and the metal layer 3000 or the adhesive member 4000, but in the case where the size relation is as given above, the burrs can be a length that does not extend beyond the ridges 24, so the likelihood that short-circuiting will occur can be reduced. More specifically, the length of the bottom surfaces 50b and the upper surfaces 50a of the second texture pattern 50 along the second lines 76 is preferably 0.5 µm to 5 µm, and more preferably 1 µm to 3 µm.

There are no restrictions on the method for forming the protective film 40 that is used to form the second texture pattern 50, but a method that involves directivity, such as sputtering or vapor deposition, is preferable. This allows a difference to be created between the thickness of the protective film 40 formed on the upper surfaces 30a and bottom surfaces 30b of the first texture pattern 30, and the thickness of the protective film 40 formed on the surfaces that link the upper surfaces 30a and bottom surfaces 30b of the first texture pattern 30, so that the burrs produced when the semiconductor wafer 100 is split along the second lines 76 will be more likely to break at portions where the protective film 40 is thin, that is, at portions of the first texture pattern 30 formed at the surfaces that link the upper surfaces 30*a* and bottom surfaces 30*b* of the first texture pattern 30, and thus the length of the burrs can be short.

The thickness of the protective film 40 formed on the bottom surfaces 30*b* of the first texture pattern 30 is preferably less than the height from the bottom surfaces 30*b* to the upper surfaces 30*a* of the first texture pattern 30. This affords the proper separation of the burrs produced during splitting. In this embodiment, the thickness of the protective film 40 is 0.2 μm.

The protective film 40 may be formed not just on the first texture pattern 30, but also over the entire upper surface of the semiconductor structure 20, except for part of the ridges 24. This prevents short-circuiting between the n-side semiconductor layer 21 (or the substrate 10) and the p-side semiconductor layer 23 of the semiconductor structure 20.

After the step of forming the second texture pattern 50, there may be a step of forming electrodes. These electrodes, for example, can be formed with the p-side electrode on the ridges 24 and the n-side electrode on the lower surface of the substrate 10 (the main surface 100*b* of the semiconductor wafer 10).

Step of Splitting Semiconductor Wafer 100

Figure 7:
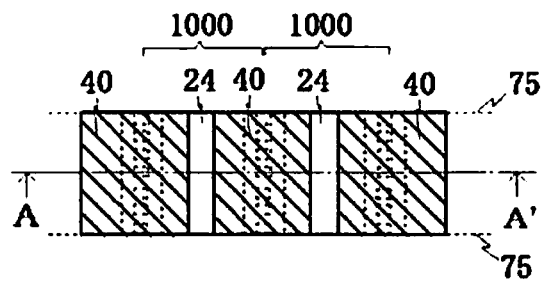
FIG. 7 is a plan view illustrating a method for manufacturing the semiconductor laser element according to the first embodiment.
Figure 8A:
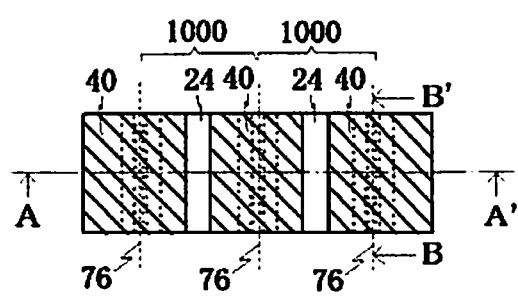
Figure 8C:
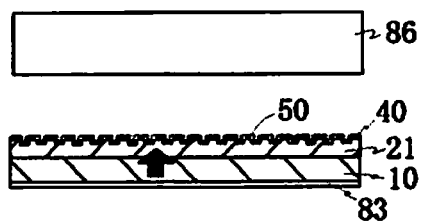
Figure 8B:
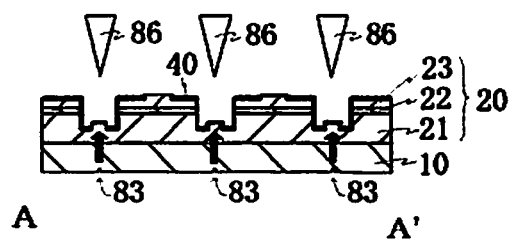
Figure 9A:
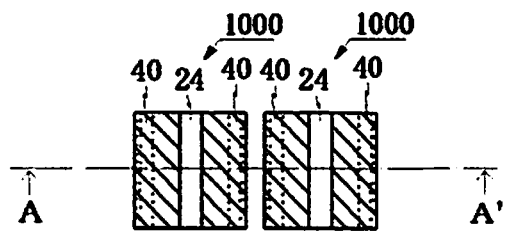
Figure 9B:
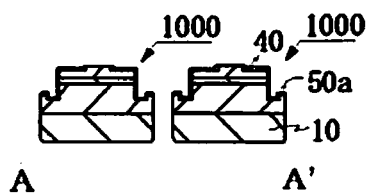

As shown in FIGS. 7 to 9, the semiconductor wafer 100 is split along the first lines 75, and is split along the second lines 76 with the main surface 100*b* side of the semiconductor wafer 100 serving as the starting point. First, as shown in FIG. 7, laser bars are formed in which a cleavage plane has been formed by splitting along the first lines 75. Next, as shown in FIGS. 8*a* to 8*c*, the obtained laser bars are split along the second lines 76. Then, as shown in FIGS. 9*a* and 9*b*, splitting of the laser bars produces a plurality of semiconductor laser elements 1000. In this embodiment, the length of the semiconductor laser element 1000 in the cavity length direction is 1.2 mm, and the length in the cavity width direction is 0.15 mm. With a splitting sequence such as this, since the laser bars are configured such that a plurality of semiconductor laser elements 1000 are arranged in the direction of the first lines 75, forming dielectric films at the cleavage planes of the laser bars allows the formation of the dielectric films of the plurality of semiconductor laser elements 1000 to be performed in a single operation, and thus productivity can be enhanced. Furthermore, the semiconductor wafer 100 can be split first along the second lines 76 and then along the first lines 75.

As shown in FIGS. 8*a* to 8*c*, the splitting along the second lines 76 in this embodiment is caused as follows. Cracks begin forming on the lower surface side of the substrate 10, and these cracks propagate upward (to the semiconductor structure 20 side; in the arrow direction shown in FIGS. 8*b* and 8*c*), and the laser bars are completely separated at the second texture pattern 50. Examples of a method with which such splitting is possible is shown in FIGS. 8*b* and 8*c* include forming splitting commencement grooves 83 in advance to allow cracks to start in the lower surface of the substrate 10 and then placing a blade-like jig 86 along the second lines 76 on the second texture pattern 50 or rotating a circular roller in the direction of the second lines 76.

In the case of forming the splitting commencement grooves 83, it is preferable that they are formed as much as possible over the entire second lines 76. In the case where there are regions with no splitting commencement grooves 83, the splitting along the second lines 76 will deviate from the direction of the second lines, but in the case where the splitting commencement grooves 83 are formed continuously, deviation of the splitting from the direction of the second lines 76 can be suppressed.

Semiconductor Laser Element 1000

Figure 10:
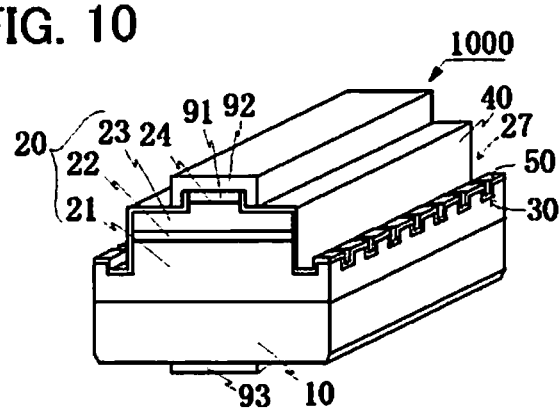
FIG. 10 is an oblique view of the semiconductor laser element according to the first embodiment, as seen from an angle.

As shown in FIG. 10, the semiconductor laser element 1000 obtained with the manufacturing method according to the first embodiment has a semiconductor structure 20 that has a cavity, and the ends of the semiconductor structure 20 in the cavity width direction are provided with stepped parts 27 that extend along the cavity length (that is, a stepped part that corresponds to a portion of the grooves 25), and the first texture pattern 30 that extends in the cavity length direction on the bottom surface of the stepped parts 27. Further, forming the protective film 40 on the upper surfaces 30*a*, the bottom surfaces 30*b*, or the entire surface of the first texture pattern 30 allows providing the second texture pattern 50. FIG. 10 is an oblique view of the i laser element 1000 as seen from an angle.

In FIG. 10, the protective film 40 is provided over the entire surface of the upper surfaces 30*a* of the first texture pattern 30 on portions adjacent to both side surfaces (ends of the semiconductor structure) in the cavity width direction of the semiconductor structure 20, but this is not the only option. Specifically, the protective film 40 may be formed on just the upper surfaces 30*a* or just the bottom surfaces 30*b* of the first texture pattern 30.

As shown in FIG. 10, for example, a p-side electrode 91 and a p pad electrode 92 are formed on the upper surfaces of the ridges 24, and an n-side electrode 93 is formed on the lower surface of the substrate 10.

Step of Mounting Semiconductor Laser Element 1000 on Support Member 2000

Figure 11:
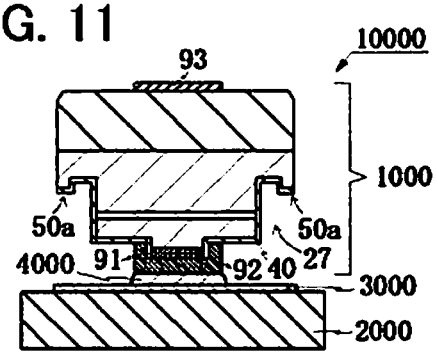
FIG. 11 is a diagram illustrating a method for manufacturing the semiconductor laser device according to the first embodiment, and is a side view of the semiconductor laser device as seen from the side surface on the cavity end surface side.

The semiconductor laser element 1000 obtained by splitting the semiconductor wafer 100 along the first lines 75 and the second lines 76 is mounted on the support member 2000. For example, a semiconductor laser device 10000 can be produced using an adhesive member 4000 to fix the side of the semiconductor laser element 1000 on which the stepped part 27 is formed to the support member 2000. As shown in FIG. 11, the semiconductor laser device 10000 is such that the side of the semiconductor laser element 1000 on which the stepped part 27 is formed is opposite the support member 2000, and the p pad electrode 92 of the semiconductor laser element 1000 is bonded via the adhesive member 4000 (such as AuSn or another such conductive material) to a metal layer 3000 (such as a multilayer film in which titanium, platinum, and gold are stacked in that order starting from the support member 2000 side) formed on the upper surface of the support member 2000 (a base member made of AlN, for example). With a semiconductor laser device 10000 such as this, heat generated inside the semiconductor structure 20 during the drive of the semiconductor laser element 1000 can be efficiently released to the support member 2000. FIG. 11 is a side view of the semiconductor laser element 1000 as seen from the side surface on the cavity end surface side.

Second Embodiment

The second embodiment differs from the first embodiment in the step of forming a second texture pattern 51. The step of forming the second texture pattern according to the second embodiment will be described through reference to FIGS. 12*a* to 14*d*. The second embodiment is substantially the same as what was described in the first embodiment, except for the step of forming the second texture pattern. The size, material, and so forth of the various members can be the same as those described in the first embodiment.

Figure 12A:
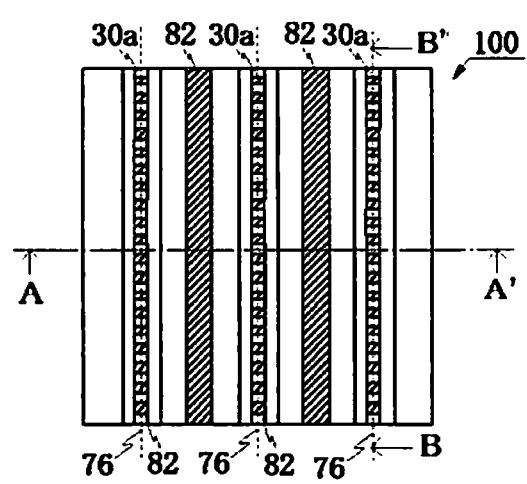
FIGS. 12a to 22d are diagrams illustrating a method for manufacturing the semiconductor laser element according to still other embodiments, with FIGS. 12a to 22a being plan views, FIGS. 12b to 22b cross sections along the A-A line in FIGS. 12a to 22a, FIGS. 12c to 22c cross sections along the B-B line in FIGS. 12a to 22a, respectively.
Figure 12C:
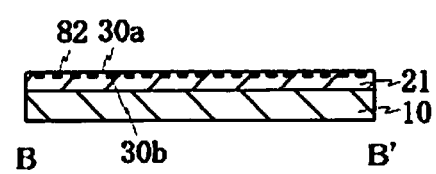
Figure 12B:
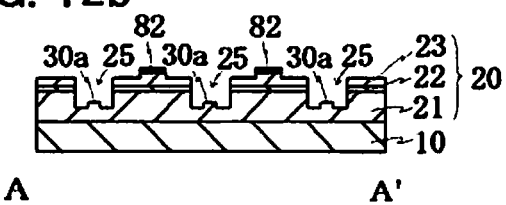
Figure 13A:
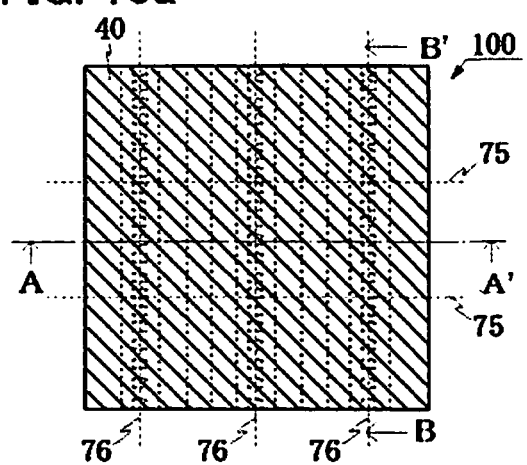
Figure 13C:
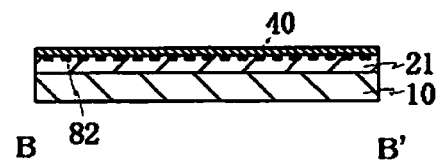
Figure 13B:
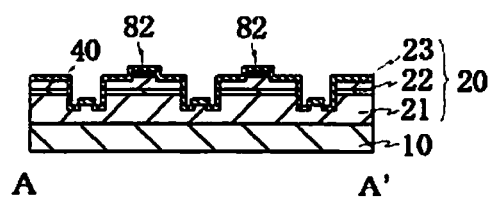

The semiconductor laser element according to the second embodiment is manufactured as follows. First, the grooves 25 that extend along the second lines 76 are formed on the main surface 100a side of the semiconductor wafer 100, and the first texture pattern 30 is formed along the second lines 76 on the bottom surfaces of the grooves 25. The grooves 25 and the first texture pattern 30 can be formed by the same method as that described in the first embodiment. After this, the second texture pattern 51 is formed. An example of the step of forming the second texture pattern 51 is shown in FIGS. 12a to 12c, in which first a resist 82 is formed on the bottom surfaces 30b of the first texture pattern 30 by photolithography. Then, the protective film 40 (such as SiO$_2$) is formed over the entire first texture pattern 30. In this embodiment, as shown in FIGS. 13a to 13c, the protective film 40 is formed over the entire main surface 100a of the semiconductor wafer 100. Next, the resist 82 is lifted off to remove the resist 82 and the protective film 40 that was formed over the resist 82, which forms the second texture pattern 51 as shown in FIGS. 14a to 14d. Before the protective film 40 is formed over the entire main surface 100a of the semiconductor wafer 100, the resist 82 can also be formed on the upper surfaces of the ridges 24, which allows forming of an opening in the protective film 40 on the upper surfaces of the ridges 24 when the second texture pattern 51 is formed by lift-off. After forming the second texture pattern 51, the semiconductor laser elements according to the second embodiment are obtained by splitting along the first lines, and splitting along the second lines using the main surface 100b of the semiconductor wafer as the origin of the splitting, by the same method as in the first embodiment.

Figure 14A:
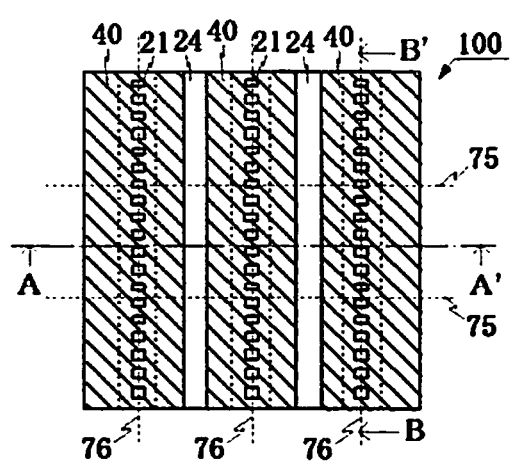
Figure 14B:
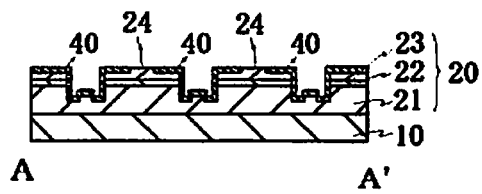
Figure 14C:
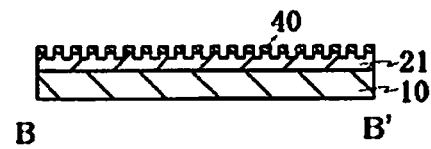
Figure 14D:
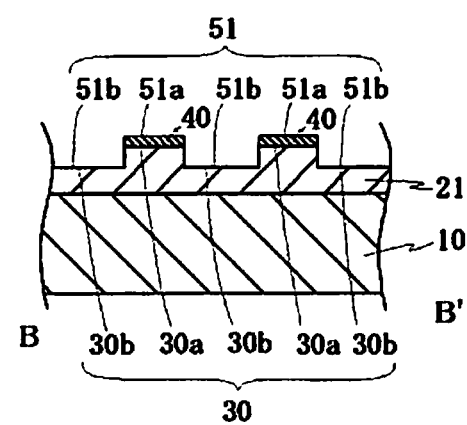

As shown in FIG. 14d, covering the upper surfaces 30a of the first texture pattern 30 with the protective film 40 allows forming the second texture pattern 51. Specifically, the second texture pattern 51 is defined by "upper surfaces 51a" that match up with the upper surfaces of the protective film 40 formed on the upper surfaces 30a of the first texture pattern 30, and "bottom surfaces 51b" that match up with the bottom surfaces 30b of the first texture pattern 30 and are at lower positions than the upper surfaces 51a, and the upper surfaces 51a and the bottom surfaces 51b are arranged in a repeating pattern along the second lines 76.

With the method for manufacturing a semiconductor laser element according to the second embodiment, the first texture pattern 30 and the second texture pattern 51 are formed at positions where the complete separation is performed. Therefore, in the case where burrs are produced, they will be generated with the length of the upper surfaces 51a and/or the bottom surfaces 51b of the second texture pattern 51, so the length of the burrs can be kept short.

The step of forming the second texture pattern 51 may be performed in a method other than the above-mentioned method. Specifically, after the formation of the first texture pattern, a protective film (such as SiO$_2$) is formed over the entire first texture pattern, and a resist is formed on the upper surfaces of the protective film formed on the upper surfaces of the first texture pattern. At this point, no resist is formed on the upper surfaces of the protective film formed on the bottom surfaces of the first texture pattern. Next, the resist formed above the upper surfaces of the first texture pattern is used as an etching mask, and the protective film formed on the bottom surfaces of the first texture pattern is etched. The resist is then removed to form the second texture pattern 51.

Third Embodiment

The third embodiment differs from the first embodiment and the second embodiment in the step of forming a second texture pattern 52. The step of forming the second texture pattern according to third embodiment will be described through reference to FIGS. 15 to 17. The third embodiment is substantially the same as what was described in the first embodiment, except for the step of forming the second texture pattern. The size, material, and so forth of the various members can be the same as those described in the first embodiment.

Figure 15A:
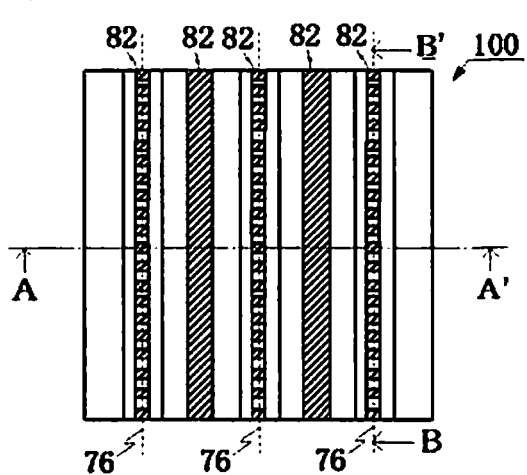
Figure 15C:
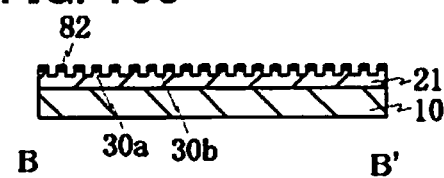
Figure 15B:
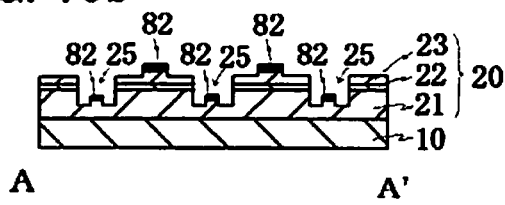
Figure 16A:
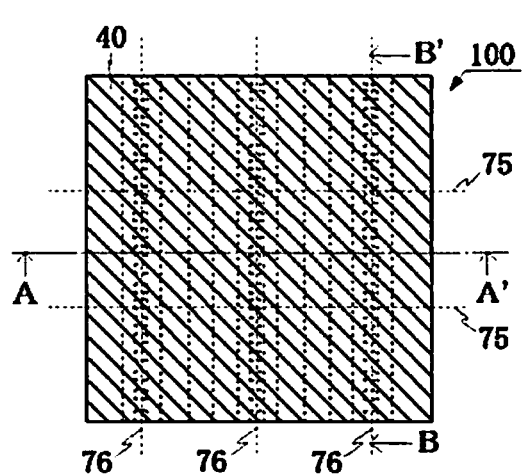
Figure 16C:
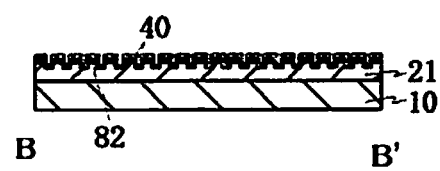
Figure 16B:
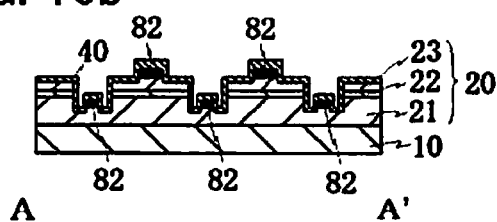

The semiconductor laser element according to the third embodiment is manufactured as follows. First, the grooves 25 that extend along the second lines 76 are formed on the main surface 100a side of the semiconductor wafer 100, and the first texture pattern 30 is formed along the second lines 76 on the bottom surfaces of the grooves 25. The grooves 25 and the first texture pattern 30 can be formed by the same method as that described in the first embodiment. After this, the second texture pattern 52 is formed. An example of the step of forming the second texture pattern 52 is shown in FIGS. 15a-15c, in which first a resist 82 is formed on the upper surfaces 30a of the first texture pattern 30 by photolithography. Then, the protective film 40 (such as SiO$_2$) is formed over the entire first texture pattern 30, as shown in FIGS. 16a to 16c. Next, the resist 82 is lifted off to remove the resist 82 and the protective film 40 that was formed over the resist 82, so that the second texture pattern 52 can be formed as shown in FIGS. 17a to 17d. Before the protective film 40 is formed over the entire main surface 100a of the semiconductor wafer 100, the resist 82 can also be formed on the upper surfaces of the ridges 24, which allows forming of an opening in the protective film 40 on the upper surfaces of the ridges 24 when the second texture pattern 52 is formed by lift-off. After the second texture pattern 52 has been formed, the semiconductor laser elements according to the third embodiment are obtained by splitting along the first lines, and splitting along the second lines using the main surface 100b of the semiconductor wafer as the origin, by the same method as in the first embodiment.

Figure 17A:
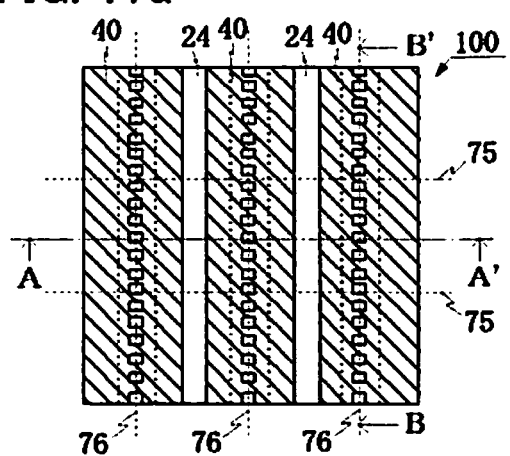
Figure 17C:
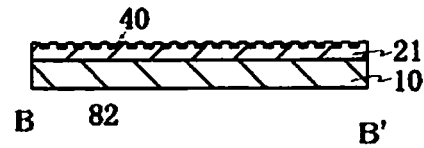
Figure 17D:
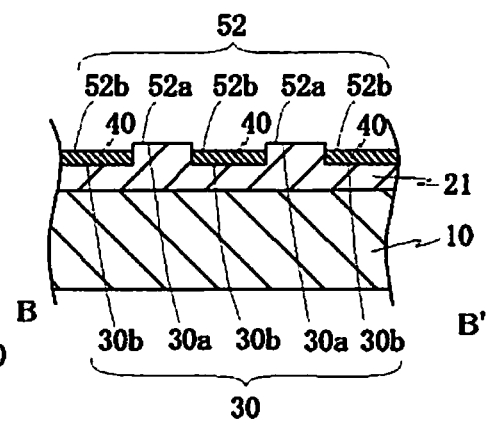
Figure 17B:
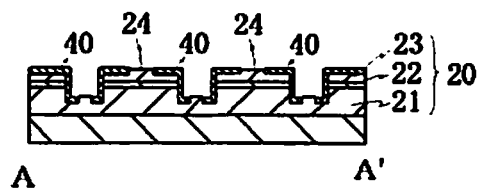

As shown in FIG. 17d, the second texture pattern 52 is formed by covering the bottom surfaces 30b of the first texture pattern 30 with the protective film 40. Specifically, the second texture pattern 52 is defined by "upper surfaces 52a" that match up with the upper surfaces of the first texture pattern 30 formed on the upper surfaces 30a of the first texture pattern 30, and "bottom surfaces 52b" that match up with the upper surfaces 30b of the protective film 40 and are at lower positions than the upper surfaces 52a, and the upper surfaces 52a and the bottom surfaces 52b are arranged in a repeating pattern along the second lines 76.

With the method for manufacturing a semiconductor laser element according to the second embodiment, the first texture pattern 30 and the second texture pattern 52 are formed at portions on which the wafer is completely separated. Therefore, in the case where burrs are produced, they will be generated with the length of the upper surfaces 52a and/or the bottom surfaces 52b of the second texture pattern 52, so the length of the burrs can be short.

The step of forming the second texture pattern 52 may be performed in a method other than what is described above. Specifically, after the formation of the first texture pattern 30, a protective film is formed over the entire first texture pattern 30, and a mask such as a resist made of SiO$_2$ is formed on the upper surfaces of the protective film formed on the bottom surfaces of the first texture pattern. Next, the mask formed on the protective film is used as an etching mask, and the protective film formed on the upper surfaces of the first texture pattern is etched. The resist is then removed to form the second texture pattern 52.

Fourth Embodiment

The method for manufacturing a semiconductor laser element according to the fourth embodiment will be described through reference to FIGS. 18a to 22d. The size, material, and so forth of those members that are shared with the first embodiment can be the same as those described in the first embodiment.

In the method for manufacturing a semiconductor laser element according to the third embodiment the semiconductor wafer 100 is split along the first lines 75 parallel to the cavity width direction 26 and along the second lines 76 parallel to the cavity length direction 26 to obtain a plurality of semiconductor laser elements. This manufacturing method includes a step of preparing the semiconductor wafer 100, a step of forming the grooves 25 that extend along the second lines 76 on the main surface 100a side of the semiconductor wafer 100, a step of forming the protective film 40 on the bottom surfaces of the grooves 25, a step of forming a texture pattern 60 on the bottom surfaces of the grooves 25 by removing part of the protective film 40 along the second lines 76, and a step of splitting the semiconductor wafer 100 along the first lines 75 and of splitting along the second lines 76 using the main surface 100b side of the semiconductor wafer 100 as the origin of the splitting.

Figure 18A:
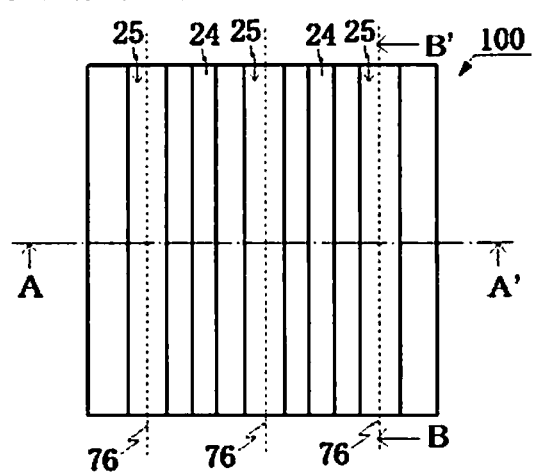
Figure 18C:
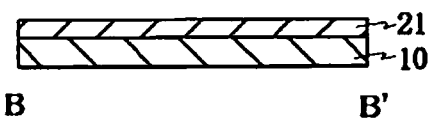
Figure 18B:
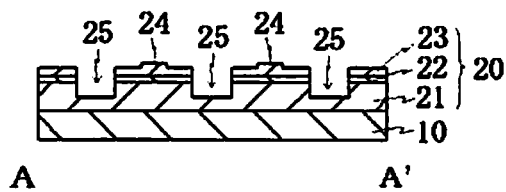
Figure 19A:
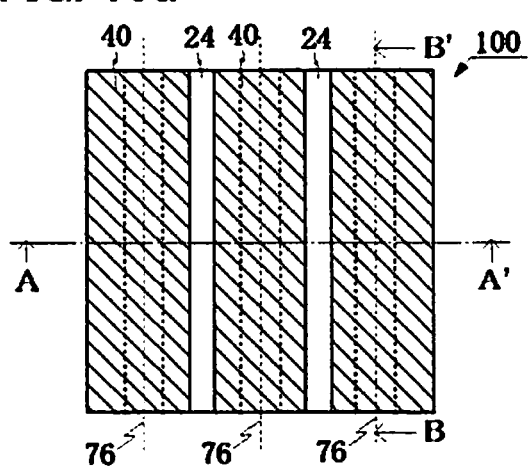
Figure 19C:
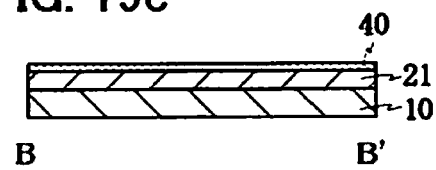
Figure 19B:
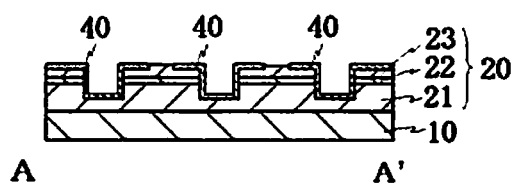
Figure 20A:
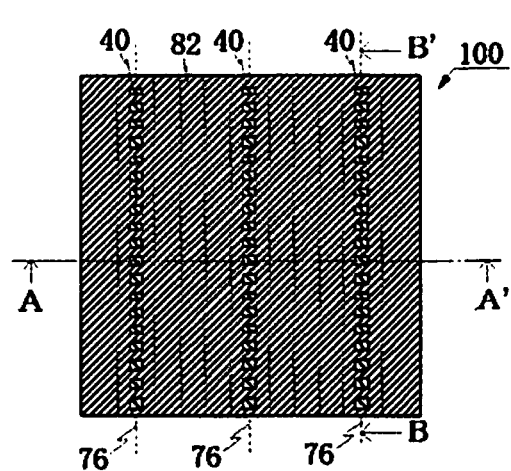
Figure 20C:
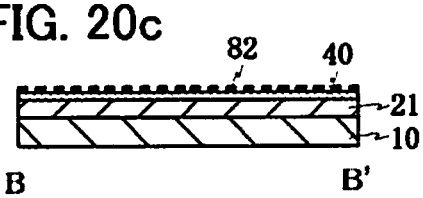
Figure 20B:
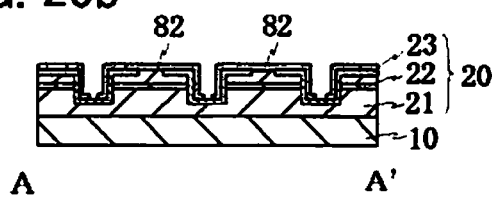
Figure 21A:
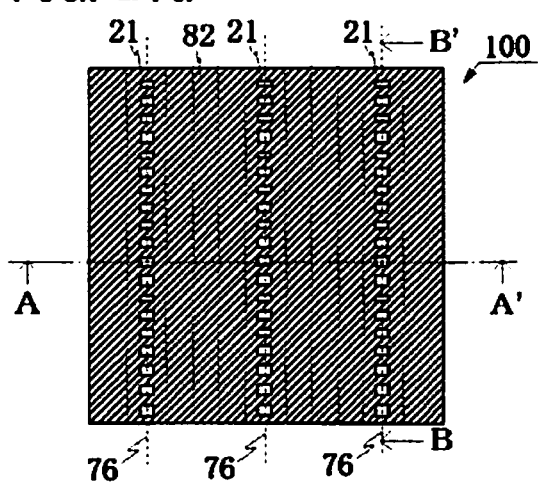
Figure 21C:
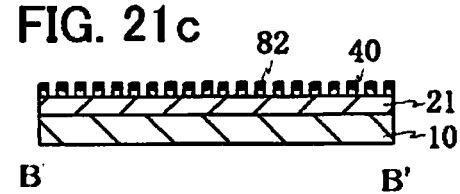
Figure 21B:
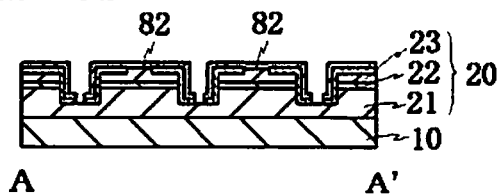
Figure 22A:
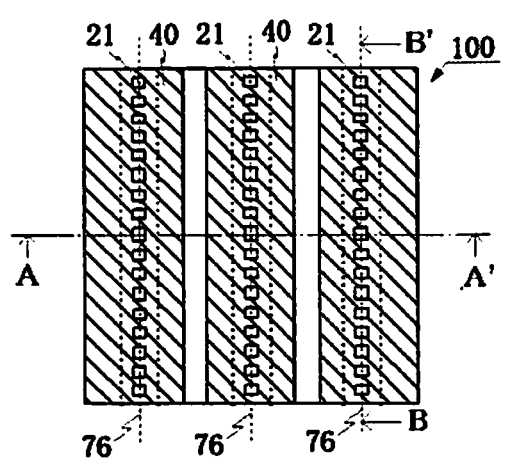
Figure 22B:
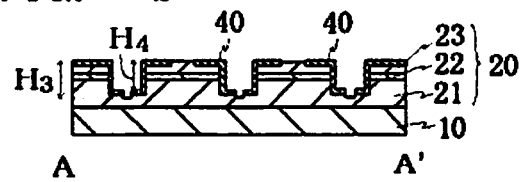
Figure 22C:
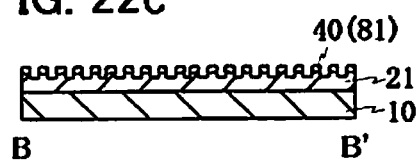

As shown in FIGS. 18a to 18c, the method for manufacturing a semiconductor laser element according to the fourth embodiment includes forming the grooves 25 that extend along the second lines 76 on the main surface 100a side of the semiconductor wafer 100. The grooves 25 can be formed by the method discussed in the first embodiment. After forming the grooves 25, the texture pattern 60 is formed. As an example of the step of forming the texture pattern 60, first, as shown in FIGS. 19a to 19c, the protective film 40 (such as $SiO_2$) is formed on the bottom surfaces of the grooves 25. Then, a pattern of the resist 82 is formed by photolithography in at least the region that will subsequently become the upper surfaces 60a of the texture pattern 60 as shown in FIGS. 20a to 20c. Next, as shown in FIGS. 21a to 21c, the resist 82 is used as an etching mask to etch a portion of protective film 40 which is not covered by the resist 82. Finally, the resist 82 is removed, and the semiconductor structure 20 is etched using the remaining protective film 40 as an etching mask, so that the texture pattern 60 is formed as shown in FIGS. 22a to 22c. Before the semiconductor structure 20 is etched, an etching mask may be formed on the upper surfaces of the ridges 24 so that the ridges 24 will not be etched before the semiconductor structure 20 is etched. After the texture pattern 60 is formed, the same method as in the first embodiment is used to split along the first lines and to split along the second lines using the main surface 100b of the semiconductor wafer as the origin of the splitting, so that the semiconductor laser element according to the fourth embodiment can be obtained.

With the method for manufacturing a semiconductor laser element according to the second embodiment, the first texture pattern 30 and the second texture pattern 51 are formed at portions where the wafer is completely separated. Therefore, in the case where burrs are produced, they will be generated with the length of the upper surfaces 51a and/or the bottom surfaces 51b of the second texture pattern 51, so that the length of the burrs can be short. Also, a processing accuracy of the texture pattern 60 can be better than with the method according to the second embodiment, so that the length of the burrs produced during splitting can be reduced more securely.

Figure 22D:
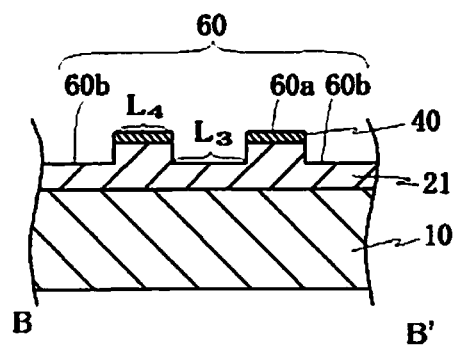

As shown in FIG. 22d, the texture pattern 60 is defined by the "upper surfaces 60a" that match up with the upper surfaces of the protective film 40, and "bottom surfaces 60b" that match up with the surface of the n-side semiconductor layer 21 of the semiconductor structure 20 and are at a lower position than the upper surfaces 60a. The texture pattern 60 has substantially the same structure as the second texture pattern 51 in the second embodiment, but is formed by a different method.

The texture pattern 60 includes the upper surfaces 60a and the bottom surfaces 60b that are at a lower position than the upper surfaces 60a. The length of the bottom surfaces 60b of the texture pattern 60 along the second lines 76, which is "$L_3$" shown in FIG. 22d, is preferably less than the height from the bottom surfaces 60b of the texture pattern 60 to the surface on the main surface 100a side of the semiconductor wafer 100 (the upper surfaces of the ridges 24), which is "$H_3$" shown in FIG. 22b, and the length of the upper surfaces 60a of the texture pattern 60 along the second lines 76, which is "$L_4$" shown in FIG. 22d, is preferably less than the height from the upper surfaces 60a of the texture pattern 60 to the surface on the main surface 100a side of the semiconductor wafer 100 (the upper surfaces of the ridges 24), which is "$H_4$" shown in FIG. 22b.

The step of forming the texture pattern 60 is preferably performed by etching. This allows the length of the texture pattern 60 along the second lines 76 to be accurately controlled, and thus a possibility of short-circuiting caused by burrs can be reduced.

Embodiments of the present invention may include methods other than those discussed in the first to fourth embodiments, so long as the second texture pattern (50, 51, or 52) or the texture pattern 60 is formed along the second lines 76 on the opposite side of the semiconductor wafer 100 from the side that becomes the origin of splitting before the splitting of the semiconductor wafer 100 along the second lines 76.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A semiconductor laser element comprising:
   a semiconductor structure having an optical cavity, the semiconductor structure including
       a pair of stepped parts arranged on a first main surface side of the semiconductor structure respectively at both ends of the semiconductor structure in a cavity width direction with the stepped parts extending along a cavity length direction, and
       a first texture pattern extending in the cavity length direction on a bottom surface of each of the stepped parts, the first texture pattern including a plurality of recesses and/or a plurality of protrusions along the cavity length direction; and
   a protective film covering at least part of the first texture pattern to define a second texture pattern having upper surfaces and bottom surfaces that are at a lower position than the upper surfaces, a length of the bottom surfaces of the second texture pattern along the cavity length direction being less than a height from the bottom surfaces of the second texture pattern to a surface on the first main surface side of the semiconductor structure, a length of the upper surfaces of the second texture pattern along the cavity length direction being less than a height from the upper surfaces of the second texture pattern to the surface on the first main surface side of the semiconductor structure.

2. The semiconductor laser element according to claim 1, wherein
the protective film covers an entire surface of the first texture pattern.

3. The semiconductor laser element according to claim 1, wherein
the protective film covers upper surfaces of the protrusions or bottom surfaces of the recesses of the first texture pattern.

4. The semiconductor laser element according to claim 1, wherein
the semiconductor structure includes a substrate made of GaN.

5. The semiconductor laser element according to claim 1, wherein
height difference between upper surfaces of the protrusions and bottom surfaces of the recesses of the first texture pattern is between 0.2 µm and 0.5 µM.

6. A semiconductor laser device comprising:
the semiconductor laser element according to claim 1; and
a support member on which the semiconductor laser element is mounted, with a side of the semiconductor laser element on which the stepped parts are formed being fixed to the support member with an adhesive member.

7. A semiconductor laser element comprising:
a semiconductor structure having an optical cavity, the semiconductor structure including
a pair of stepped parts arranged on a first main surface side of the semiconductor structure respectively at both ends of the semiconductor structure in a cavity width direction with the stepped parts extending along a cavity length direction, and
a first texture pattern extending in the cavity length direction on a bottom surface of each of the stepped parts, the first texture pattern including a plurality of recesses and/or a plurality of protrusions along the cavity length direction, the first texture pattern including upper surfaces that coincide with upper surfaces of the protrusions that protrude upward from the bottom surface of a corresponding one of the stepped parts, and bottom surfaces that are lower than the upper surfaces of the first texture pattern and have the same height as the bottom surface of the corresponding one of the stepped parts, the upper surfaces of the first texture pattern and the bottom surfaces of the first texture pattern being arranged in a repeating pattern along the cavity length direction; and
a protective film covering at least part of the first texture pattern to define a second texture pattern along the cavity length direction.

8. The semiconductor laser element according to claim 7, wherein
the protective film covers an entire surface of the first texture pattern.

9. The semiconductor laser element according to claim 7, wherein
the protective film covers upper surfaces of the protrusions or bottom surfaces of the recesses of the first texture pattern.

10. The semiconductor laser element according to claim 7, wherein
the semiconductor structure includes a substrate made of GaN.

11. The semiconductor laser element according to claim 7, wherein
height difference between upper surfaces of the protrusions and bottom surfaces of the recesses of the first texture pattern is between 0.2 µm and 0.5 µm.

12. A semiconductor laser device comprising:
the semiconductor laser element according to claim 7; and
a support member on which the semiconductor laser element is mounted, with a side of the semiconductor laser element on which the stepped parts are formed being fixed to the support member with an adhesive member.

13. A semiconductor laser element comprising:
a semiconductor structure having an optical cavity, the semiconductor structure including
a pair of stepped parts arranged on a first main surface side of the semiconductor structure respectively at both ends of the semiconductor structure in a cavity width direction with the stepped parts extending along a cavity length direction, and
a first texture pattern extending in the cavity length direction on a bottom surface of each of the stepped parts, the first texture pattern including a plurality of recesses and/or a plurality of protrusions along the cavity length direction; and
a protective film covering at least part of the first texture pattern, a thickness of the protective film formed on bottom surfaces of the first texture pattern being less than a height from the bottom surfaces of the first texture pattern to upper surfaces of the first texture pattern.

14. The semiconductor laser element according to claim 13, wherein
the protective film covers an entire surface of the first texture pattern.

15. The semiconductor laser element according to claim 13, wherein
the semiconductor structure includes a substrate made of GaN.

16. The semiconductor laser element according to claim 13, wherein
height difference between upper surfaces of the protrusions and bottom surfaces of the recesses of the first texture pattern is between 0.2 µm and 0.5 µm.

17. A semiconductor laser device comprising:
the semiconductor laser element according to claim 13; and
a support member on which the semiconductor laser element is mounted, with a side of the semiconductor laser element on which the stepped parts are formed being fixed to the support member with an adhesive member.

* * * * *